United States Patent [19]

Hannai

[11] Patent Number: 4,872,142
[45] Date of Patent: Oct. 3, 1989

[54] SEMICONDUCTOR MEMORY DEVICE WITH IMPROVED BIT LINE ARRANGEMENT

[75] Inventor: Seiichi Hannai, Tokyo, Japan

[73] Assignee: NEC Corporation, Tokyo, Japan

[21] Appl. No.: 110,825

[22] Filed: Oct. 21, 1987

[30] Foreign Application Priority Data

Oct. 21, 1986 [JP] Japan .................................. 61-251015

[51] Int. Cl.$^4$ .............................................. G11C 7/00
[52] U.S. Cl. .................................. 365/189.07; 365/51;
365/149; 365/208; 365/210
[58] Field of Search ................... 365/51, 149, 189, 190,
365/205, 207, 208, 210, 230; 307/530

[56] References Cited

U.S. PATENT DOCUMENTS

| | | | |
|---|---|---|---|
| 4,367,540 | 1/1983 | Shimohigashi | 365/189 |
| 4,581,720 | 4/1986 | Takemae | 365/189 |
| 4,636,985 | 1/1987 | Aoki et al. | 365/189 |

*Primary Examiner*—James W. Moffitt
*Attorney, Agent, or Firm*—Sughrue, Mion, Zinn, Macpeak & Seas

[57] ABSTRACT

A dynamic type semiconductor memory device with an improved bit line arrangement is disclosed. The memory device comprises at least first and second pairs of bit lines and a sense amplifier having a pair of input terminals to which one pair of bit lines among the first and second bit line pairs are selectively connected, and is featured in that the bit lines of the first bit line pair and the bit lines of the second bit line pair are alternately arranged in parallel.

5 Claims, 4 Drawing Sheets

SEMICONDUCTOR MEMORY DEVICE WITH IMPROVED BIT LINE ARRANGEMENT

BACKGROUND OF THE INVENTION:

The present invention relates to a dynamic type semiconductor memory device, and more particularly to a dynamic memory employing a shared sense amplifier scheme.

Memory capacity of dynamic memories has been increasing remarkably and 1 Mega-bit dynamic memories are becoming popular in the field. Accompanied by the increase in the memory capacity the number of memory cells connected to each bit line is also increased, and therefore the effective capacitance of the bit line is increased. Since a level of a signal read out to a bit line from a selected memory cell is determined by a ratio of a capacitance CM of a memory cell to the bit line capacitance CD, i.e. CM/CD the increase in the number of memory cells to the respective bit lines lowers the read out signal on the bit line, and it was difficult to sense a read out signal on a bit line with a high sensitivity and at a high speed.

In order to solve the above disadvantage, the so-called shared-sense amplifier scheme has been proposed and advantageously employed in 256K-bit and 1 Mega-bit dynamic memories. According to the shared-sense amplifier scheme, memory cells associated with each sense amplifier are arranged two or more pairs of bit lines and only one pair of bit lines are selectively connected to the sense amplifier. Accordingly, the manner of memory cells connected to each bit line is reduced and therefore the effective capacitance of the bit line is effectively reduced to increase the sensitivity in reading a signal from a selected memory cell. The details of the above shared-sense amplifier scheme is disclosed in the U.S. Pat. No. 4,366,559 issued to Misaizu et al.

In dynamic memories, a plurality pairs of bit lines are arranged in parallel with each other. Half the bit lines are arranged in parallel at one side of the sense amplifiers and another half the bit lines are arranged in parallel at the other side of the sense amplifiers, in the typical shared-sense amplifier scheme. In a read operation, the bit lines at one or another side of the sense amplifiers are electrically connected to the sense amplifiers and subjected to amplification by the sense amplifiers. Through the amplification, in the above one side bit lines, each pair of bit lines which have been precharged to a predetermined level, are changed to different potentials. Particularly, one of each pair of bit lines is discharged to the ground potential. Since the bit lines are arranged in parallel, a stray capacitance $C_{BB}$ present between each adjacent two bit lines. Therefore, a change in potential at one bit line affects its adjacent bit line or lines as noise through the stray capacitance $C_{BB}$.

This reduces an operational margin in the memories and substantially lowers the sensitivity in reading.

SUMMARY OF THE INVENTION

It is an object of the present invention to provide a dynamic type semiconductor memory having an improved shared-sense amplifier scheme.

It is another object of the present invention to provide a dynamic type semiconductor memory having a high sensitivity in reading information.

The dynamic type semiconductor memory device according to the present invention comprises at least first and second bit line pairs each including a pair of bit lines arranged in parallel, a sense amplifier having a pair of input terminals and a transfer circuit for selectively connecting one pair of bit lines in the above at least first and second bit line pairs to the pair of input terminals of the sense amplifier, and is featured in that the bit lines of the first bit line pair and the bit lines of the second bit line pair are alternately arranged in parallel.

According to the present invention, between the pair of bit lines connected to the input terminals of the sense amplifier there is provided at least one bit line which is not connected to the sense amplifier, and hence stray capacitance between the pair of bit lines connected to the sense amplifier is effectively reduced.

DETAILED DESCRIPTION OF THE PRESENT INVENTION

Figure 1:
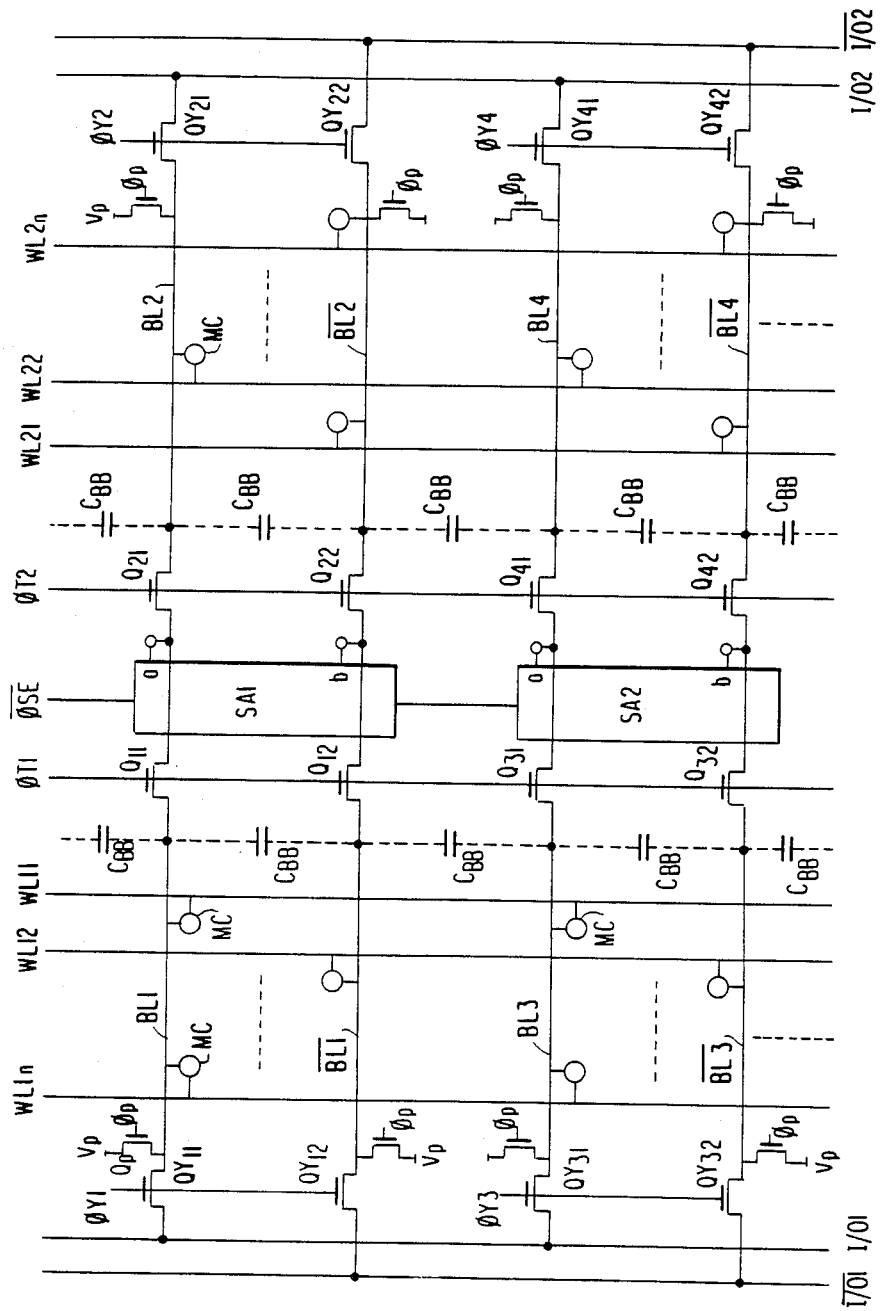
FIG. 1 is a schematic block diagram showing a prior art semiconductor memory.

A major part of a dynamic semiconductor memory according to a prior art is illustrated in FIG. 1.

In FIG. 1, four pairs of bit lines BL1, $\overline{BL1}$ - BL4, $\overline{BL4}$ are representatively shown with two sense amplifiers SA1 and SA2. A pair of bit lines BL1 and $\overline{BL1}$ are connected to a pair of input terminals a and b of the sense amplifier SA1 via a pair of transfer gates $Q_{11}$ and $Q_{12}$ and pair of bit lines BL2 and $\overline{BL2}$ are connected to the input terminals a and b of the sense amplifier SA1 via a pair of transfer gates $Q_{21}$ and $Q_{22}$. Similarly, a pair of bit lines BL3, $\overline{BL3}$ and a pair of bit lines BL4 and $\overline{BL4}$ are connected to a pair of input terminals a and b of the sense amplifier SA2 via a pair of transfer gates $Q_{31}$, $Q_{32}$ and a pair of transfer gates $Q_{41}$, $Q_{42}$, respectively. The bit lines BL1 and $\overline{BL1}$ are connected to a pair of bus lines I/01 and $\overline{I/01}$ via a pair of column selection transistors $QY_{11}$ and $QY_{12}$ which are controlled by a column selection signal $\phi Y1$ and the pair of bit lines BL3 and $\overline{BL3}$ are connected to I/01 and $\overline{I/01}$ via a pair column selection transistors QY31 and QY32 controlled by a column selection signal $\phi Y3$. Similarly, the pair of bit lines BL2 and $\overline{BL2}$ and the pair of bit lines BL4 and $\overline{BL4}$ are connected to a pair of bus lines I/02 and $\overline{I/02}$ via a pair of column selection gates QY21 and QY22 controlled by a column selection signal $\phi Y2$ and a pair of column selection transistors QY41 and QY42 controlled by a column selection signal $\phi Y4$, respectively.

A plurality of work lines WL11 - WL1n are arranged in rows and intersecting with the bit lines of the left side with respect to the sense amplifiers SA1 and SA2 and a plurality of work lines WL21 - WL2n are arranged at the right side of the sense amplifiers. One-transistor type dynamic memory cells MC are arranged at the intersections of the word lines and one of each pair of bit lines, as illustrated.

The respective bit lines are provided with precharge transistors Qp for precharging them to a precharge potential Vp in response to a precharge control signal $\phi P$.

The bus lines I/01 and $\overline{I/01}$ may be electrically connected to the bus lines I/02 and $\overline{I/02}$, respectively.

In a read operation, the respective bit lines have been precharged to Vp by the precharge transistors Qp prior to a selection of the word lines. Then, one of the word lines is selected in accordance with row address information. When one of the word lines WL11 - WL1n on the left side is to be selected, a gate control signal $\phi$T1 becomes a high (VCC) level with $\phi$T2 a low (ground) level. While, when one of the word lines WL21 - WL2n on the right side is to be selected, a gate control signal $\phi$T2 becomes a high level with a low level of $\phi$T1.

The following explanation will be given on the case where the word line WL11 is selected and all the transistors employed are N-channel insulated gate field effect transistors.

Since the word line WL11 is selected, the left side bit lines BL1, $\overline{BL1}$ and BL3 and $\overline{BL3}$ are connected to the input terminals of the sense amplifiers SA1 and SA2 by conducting transfer gate transistors $Q_{11}$, $Q_{12}$, $Q_{31}$ and $Q_{32}$ in response to the high level of $\phi$T1, while the right side bit lines BL2, $\overline{BL2}$, BL4 and $\overline{BL4}$ are electrically isolated from the sense amplifiers SA1 and SA2 because the transfer gate transistors $Q_{21}$, $Q_{22}$, $Q_{41}$ and $Q_{42}$ are non-conductive. then, memory cells MC coupled to the selected word line WL11 cause small potential changes in the respective pairs of bit lines (BL1, $\overline{BL1}$) and (BL3 and $\overline{BL3}$).

Subsequently, a sense enable signal $\overline{SE}$ changes from a high level (VCC) to a low (ground) level so that the sense amplifiers SA1 and SA2 are enabled. Accordingly, one of each pair of bit lines is discharged to the ground potential by the sense amplifier through the amplifier.

For example, in the case where the memory cell connected to the word line WL11 and the bit line BL1 and the memory cell connected to WL11 and BL3 store high level (or "1") information, the bit lines BL1 and BL3 are higher in level than the bit lines $\overline{BL1}$ and $\overline{BL3}$. The bit lines $\overline{BL1}$ and $\overline{BL3}$ are discharged to the ground level by the sense amplifiers SA1 and SA2, respectively.

Since stray capacitances $C_{BB}$ are present between the respective two adjacent bit lines, the above fall in potential at the bit lines $\overline{BL1}$ and $\overline{BL3}$ affect the bit lines BL1 and BL3 to lower the potentials of the bit lines BL1 and BL3 through the capacitances $C_{BB}$. In other words, the stray capacitances $C_{BB}$ adversely narrower the potential difference between the bit lines in each pair of bit lines, and the effective sensitivity of the sense amplifiers has been deteriorated.

Figure 2:
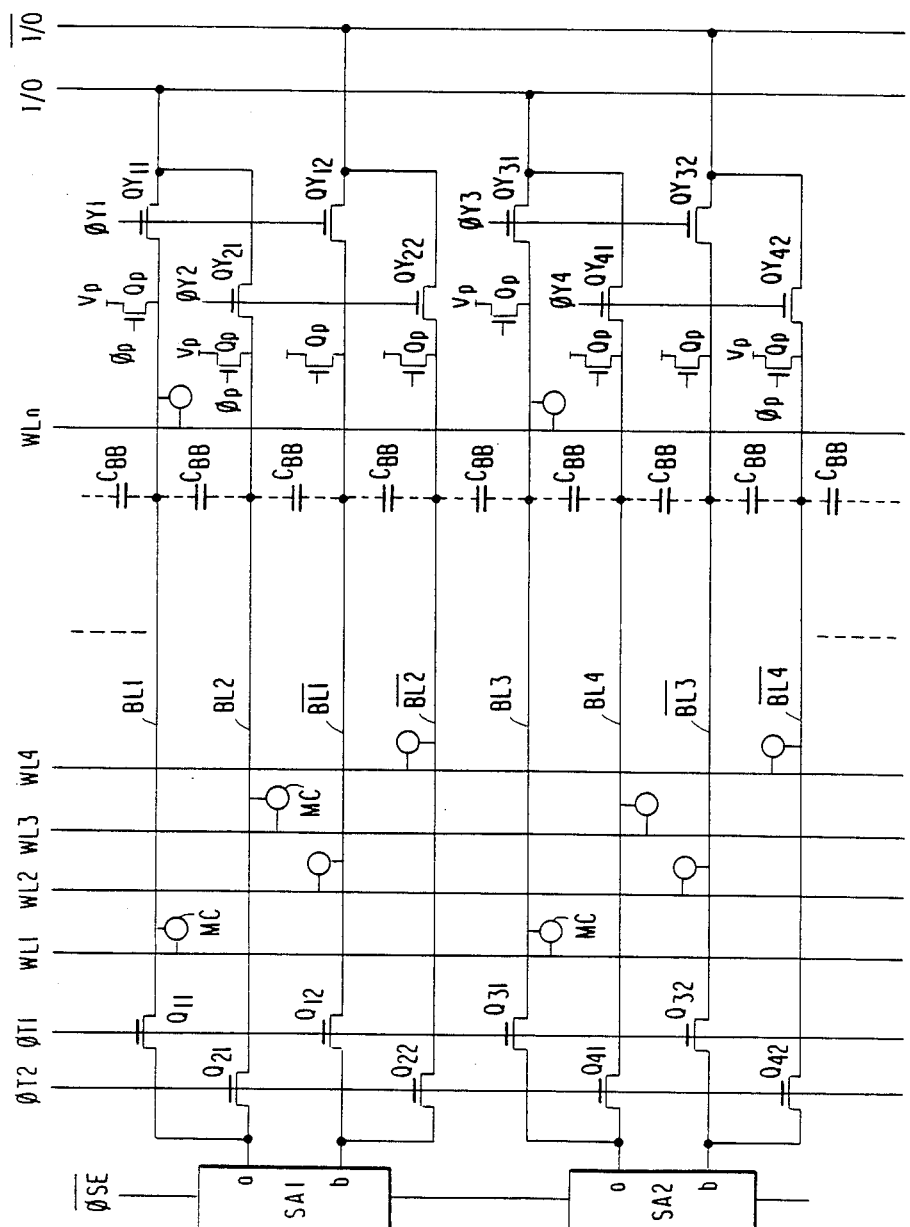
FIG. 2 is a schematic block diagram of a memory according to one embodiment of the invention.

Referring to FIG. 2, a dynamic memory according to a first embodiment of the present invention is explained.

In FIG. 2, the portions corresponding to those in FIG. 1 are denoted by the same references, and all the transistors employed are N-channel field effect transistors.

As shown in FIG. 2, bit lines of two pairs of bit lines (BL1, $\overline{BL1}$) and (BL2, $\overline{BL2}$) which are associated with the sense amplifier SA1 are alternately arranged in parallel. Namely, the bit lines BL1 and $\overline{BL1}$ of one bit line pair are arranged on both sides of the bit line BL2 of another bit line pair and the bit lines BL2 and $\overline{BL2}$ of another bit line pair are arranged on both sides of the bit lines $\overline{BL1}$ of the above one bit line pair.

The pair of bit lines BL1, BL1 are connected to a pair of input terminals a, b of a sense amplifier SA1 via a pair of transfer gate transistors Q11, Q12, while the pair of bit line BL2, BL2 are connected to the pair of input terminals a, b of the sense amplifier SA1 via a pair of transfer gate transistors Q21, Q22, respectively.

Similarly, the bit lines of two pairs of bit lines (BL3, $\overline{BL3}$) and (BL4, $\overline{BL4}$) which are electrically connected to the input terminals a and b of the sense amplifier SA2 via two pairs of transfer gate transistors ($Q_{31}$, $Q_{32}$) and ($Q_{41}$, and $Q_{42}$), respectively, are alternately arranged in parallel as illustrated.

The pair of bit lines BL1 and $\overline{BL1}$ are electrically connected to a pair of bus lines I/0 and $\overline{I/}$ via a pair of column selection transistors QY11 and QY12 controlled by a column selection signal $\phi$Y1.

Similarly, other pairs of bit lines (BL2, $\overline{BL2}$), (BL3, $\overline{BL3}$), (BL4, $\overline{BL4}$) are electrically connected to the pair of bus lines I/0 and $\overline{I/0}$ via pairs of column selection transistors (QY21, QY22), (QY31, QY32) and (QY41, QY42), respectively.

A plurality of word lines WL1 - WLn are arranged in row directions and memory cells are arranged at the respective intersections of the word line and one of the bit lines associated to the same sense amplifier. For example, memory cells MC are disposed at the intersections of (WL1, BL1), (WL2, $\overline{BL1}$), (WL3, BL2), (WL4, $\overline{BL2}$). the respective bit lines are provided with precharge transistors Qp for precharge.

A read operation of this embodiment is explained below.

Prior to a read operation, all the bit lines have been precharged to a precharge voltage Vp which may be Vcc or Vcc/2 by the precharge transistors Qp in response to the high level of $\phi$P.

When row address information is determined, one of the word lines is selected. In this instance, when the odd number word line such as WL1, WL3 is selected, the control signal $\phi$T1 is rendered high in level with a low level of $\phi$T2 so that the pair of bit lines BL1, $\overline{BL1}$ are connected to the inputs of the sense amplifier SA1 and the pair of bit lines BL3, $\overline{BL3}$ are connected to the inputs of the sense amplifier SA2, thus, the odd number of bit line pairs such as BL1, BL3 are connected to the sense amplifiers. While the transfer gate transistors $Q_{21}$, $Q_{22}$, $Q_{42}$ controlled by $\phi$T1 are all nonconductive, and hence the even number of bit line pairs (BL2, $\overline{BL2}$), (BL4, $\overline{BL4}$) are isolated from the sense amplifiers and laid in high impedance state or at a floating state.

Assuming that the word line WL1 is selected, the bit lines BL1 and $\overline{BL1}$ are electrically connected to the inputs a and b of the sense amplifier SA1 and the bit lines BL3 and $\overline{BL3}$ are electrically connected to the inputs a and b of the sense amplifier SA2. Information stored in the memory cell MC at the intersection of WL1 and BL1 is read out to the bit line BL1 and information stored in the memory cell MC at the intersection of WL1 and BL3 is provided to the bit line BL3. Thus, there are small potential differences between the bit lines BL1 and $\overline{BL1}$ and between BL3 and $\overline{BL3}$.

Then, the sense enable signal $\phi\overline{SE}$ is turned to a low active level so that the sense amplifiers SA1 and SA2 enlarge the above small potential differencs. As a result, one of the bit lines BL1 and $\overline{BL1}$ and one of the bit lines BL3 and $\overline{BL3}$ are discharged to the ground potential.

According to the present invention, the bit lines electrically connected to the sense amplifiers are not adjacent from each other. In other words, the bit lines electrically connected to the sense amplifiers and the bit lines not electrically connected to the sense amplifiers are alternately arranged one by one. Accordingly, electrostatic coupling between the bit lines electrically connected to the sense amplifiers are remarkably reduced to half the conventional case.

Namely, the coupling between the bit lines BL1 and $\overline{BL1}$ is made by a series connection of two of the capacitances $C_{BB}$ and therefore the effective value of the above coupling is $C_{BB}/2$. Similarly, the value of the coupling between the bit lines $\overline{BL1}$ and BL3 is also $C_{BB}/2$..

Accordingly, the affect of one bit line connected to a sense amplifier to other bit lines is effectively reduced and the sense amplifiers can amplify the voltage difference in the respective bit line pair with high sensitivity.

Figure 3:
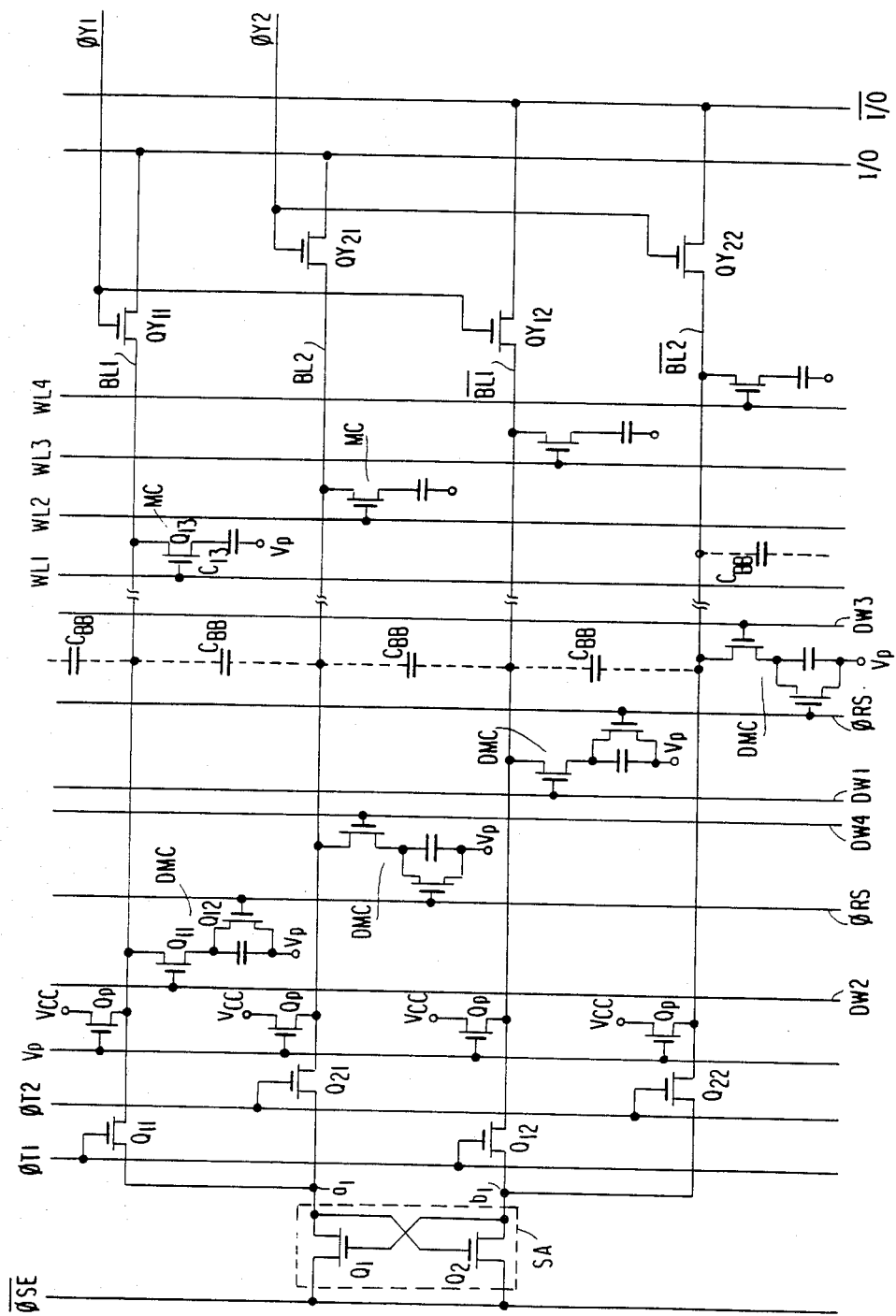
FIG. 3 is a schematic circuit diagram of a memory according to another embodiment of the present invention.

Referring to FIG. 3, a dynamic memory according to a second embodiment is explained. This embodiment corresponds to the detailed example of the above embodiment of FIG. 2. In this embodiment, four dummy word lines DW1 - DW4 are provided and dummy cells DMC each composed of transistors $Q_{11}$ and $Q_{12}$ and a capacitor $C_1$ are disposed at intersections of the dummy word lines and the bit lines. The dummy cells DMC are reset by a reset signal $\phi RS$ and the capacitance of $C_1$ is half the capacitance of a memory cell capacitor $C_{13}$. The sense amplifier SA is formed of two cross-coupled transistors $Q_1$ and $Q_2$.

Figure 4:
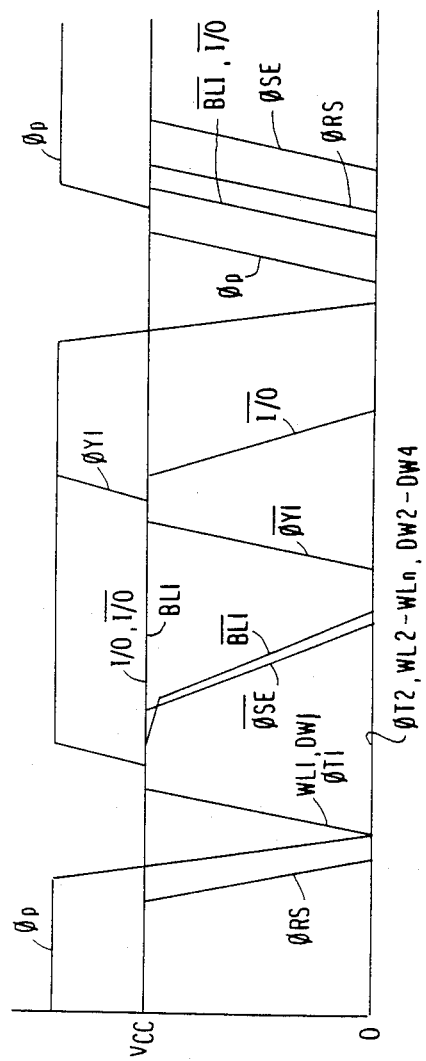
FIG. 4 is a timing wave diagram showing an operation of the memory of FIG. 3.

The respective timing diagrams of the memory of FIG. 3 are shown in FIG. 4.

As has been described by way of the embodiments, the present invention is advantageous in achieving high sensitivity of dynamic memories.

I claim:

1. A semiconductor memory device comprising:
   first to fourth bit lines arranged consecutively in parallel, said second and third bit lines being located between said first and fourth bit lines, said second bit line being located between said first and third bit lines, said third bit line being located between said second and fourth bit lines;
   first to fourth memory cells coupled to said first to fourth bit lines, respectively;
   first to fourth word lines coupled to said first to fourth memory cells, respectively, enablement of said first word line and said first to fourth bit lines providing read out of only said first memory cell, enablement of said second word line and said first to fourth bit lines providing read out of only said second memory cell, enablement of said third word line and said first to fourth bit lines providing read out of only said third memory cell, enablement of said fourth word line and said first to fourth bit lines providing read out of only said fourth memory cell;
   a sense amplifier having a pair of input terminals;
   means for selecting one of said word lines;
   a first transfer circuit for simultaneously connecting said first and third bit lines to said pair of input terminals of said sense amplifiers;
   a second transfer circuit for simultaneously connecting said second and fourth bit lines to said pair of input terminals; and
   means for enabling said first transfer circuit to thereby amplify a signal difference between said first and third bit lines by said sense amplifier when one of said first and third word lines is selected by said selecting means, and for enabling said second transfer circuit to thereby amplify a signal difference between said second and fourth bit lines when one of said second and fourth word lines is selected by said selecting means, said second and fourth bit lines not being provided with a signal from any one of the memory cells when one of said first and third word lines is selected, said first and third bit lines not being provided a signal from any one of the memory cells when one of said second and fourth word lines is selected.

2. The memory device according to claim 1, wherein said first transfer circuit includes a pair of first transistors coupled between said first and third bit lines and said pair of input terminals of said sense amplifier, and said second transfer circuit includes a pair of second transistors coupled between said second and fourth bit lines and said pair of input terminals of said sense amplifier.

3. The memory device according to claim 1, further comprising means for operatively precharging said first to fourth bit lines to a predetermined potential before said selecting means selects one of said first to fourth word lines.

4. The memory device according to claim 1, further comprising a pair of bus lines, a first column selection circuit for operatively connecting said first and third bit lines to said pair of bus lines, and a second column selection circuit for operatively connecting said second and fourth bit lines to said pair of bus lines.

5. A semiconductor memory device comprising:
   first to fourth bit lines arranged consecutively in parallel, said second and third bit lines being located between said first and fourth bit lines, said second bit line being located between said first and third bit lines, said third bit line being located between said second and fourth bit lines;
   first to fourth memory cells coupled to said first to fourth bit lines, respectively;
   first to fourth word lines coupled to said first to fourth memory cells, respectively, enablement of said first word line and said first to fourth bit lines providing read out of only said first memory cell, enablement of said second word line and said first to fourth bit lines providing read out of only said second memory cell, enablement of said third word line and said first to fourth bit lines providing read out of only said third memory cell, enablement of said fourth word line and said first to fourth bit lines providing read out of only said fourth memory cell;
   a sense amplifier having a pair of input terminals;
   means for selecting one of said word lines;
   a first transfer circuit for simultaneously connecting said first and third bit lines to said pair of input terminals of said sense amplifiers;
   a second transfer circuit for simultaneously connecting said second and fourth bit lines to said pair of input terminals;
   means for enabling said first transfer circuit to thereby amplify a signal difference between said first and third bit lines by said sense amplifier when one of said first and third word lines is selected by said selecting means, and for enabling said second transfer circuit to thereby amplify a signal difference between said second and fourth bit lines when one of said second and fourth word lines is selected by said selecting means, said second and fourth bit lines not being provided with a signal from any one of the memory cells when one of said first and third word lines is seleted, said first and third bit lines not being provided with a signal from any one of the memory cells when one of said second and fourth word lines is selected;

first to fourth dummy cells coupled to said first to fourth bit lines, respectively;

first to fourth dummy word lines coupled to said first to fourth dummy cells, respectively; and means for selecting one of said dummy word lines, said third dummy word line being selected when said first word line is selected, said first dummy word line being selected when said third word line is selected, said fourth dummy word line being selected when said second word line is selected, said second dummy word line being selected when said fourth is selected.

* * * * *

UNITED STATES PATENT AND TRADEMARK OFFICE
CERTIFICATE OF CORRECTION

PATENT NO. : 4,872,142
DATED : October 3, 1989
INVENTOR(S) : SEIICHI HANNAI

It is certified that error appears in the above-identified patent and that said Letters Patent is hereby corrected as shown below:

```
Column 2, line 56, delete "work" and insert --word--;

Column 2, line 60, delete "work" and insert --word;

Column 3, line 25, delete "then" and insert --Then--;

Column 4, line 10, delete "I/" and insert --I/O--.

Column 4, line 15, delete the second occurrence of "I/O" and
   insert --I/O--;

Column 4, line 24, delete "the" and insert --The--;

Column 6, line 67, delete "seleted" and insert --selected--.
```

Signed and Sealed this

Twenty-seventh Day of November, 1990

Attest:

HARRY F. MANBECK, JR.

*Attesting Officer*     *Commissioner of Patents and Trademarks*